(12) United States Patent
Plaze et al.

(10) Patent No.: US 7,737,786 B2
(45) Date of Patent: Jun. 15, 2010

(54) BROADBAND RECIPROCAL ACTIVE BALUN STRUCTURE

(75) Inventors: Jean-Philippe Plaze, Bois D'arcy (FR); Philippe Dueme, Orsay (FR); Benoit Mallet-Guy, Paris (FR)

(73) Assignee: Thales, Neuilly sur Siene (FR)

( * ) Notice: Subject to any disclaimer, the term of this patent is extended or adjusted under 35 U.S.C. 154(b) by 26 days.

(21) Appl. No.: 12/268,374

(22) Filed: Nov. 10, 2008

(65) Prior Publication Data
US 2009/0134951 A1 May 28, 2009

(30) Foreign Application Priority Data
Nov. 9, 2007 (FR) .................................. 07 07855

(51) Int. Cl.
*H03F 3/04* (2006.01)
(52) U.S. Cl. ............................. 330/301; 330/54; 330/53
(58) Field of Classification Search ................. 330/301, 330/54, 53
See application file for complete search history.

(56) References Cited

U.S. PATENT DOCUMENTS

| 4,885,562 | A | | 12/1989 | Ouvrard et al. | |
| 4,992,752 | A | * | 2/1991 | Cioffi ........................... | 330/54 |
| 5,070,304 | A | * | 12/1991 | Salib et al. .................... | 330/54 |
| 5,130,664 | A | * | 7/1992 | Pavlic et al. .................. | 330/55 |
| 5,880,640 | A | | 3/1999 | Dueme | |
| 6,727,762 | B1 | * | 4/2004 | Kobayashi .................... | 330/295 |
| 6,759,907 | B2 | * | 7/2004 | Orr et al. ..................... | 330/286 |
| 6,798,281 | B2 | | 9/2004 | Dueme et al. | |
| 6,930,557 | B2 | * | 8/2005 | Shigematsu ................. | 330/295 |
| 2003/0222691 | A1 | | 12/2003 | Dueme et al. | |
| 2009/0134951 | A1 | | 5/2009 | Plaze et al. | |

FOREIGN PATENT DOCUMENTS

| FR | 2895168 | 6/2007 |
| WO | WO-02/41442 | 5/2002 |

* cited by examiner

*Primary Examiner*—Patricia Nguyen
(74) *Attorney, Agent, or Firm*—Stroock & Stroock & Lavan LLP

(57) ABSTRACT

The present invention relates to the field of electronic devices known as baluns. It concerns an active balun which is broadband and reciprocal. Embodiments of the invention integrate an active splitter balun with an active combiner balun so as to form three transmission lines. A first active coupling is provided between the first and second transmission lines and a second active coupling is provided between the first and third transmission lines. The active couplings are provided by means of amplifier cells distributed along the transmission lines. Embodiments of the invention have configurable means for polarizing the different amplifier cells so as to create a specific coupling direction between the various transmission lines. The device according to the invention can be applied in the field of broadband mixers which are used, notably, in radio transmission and reception circuits.

3 Claims, 7 Drawing Sheets

BROADBAND RECIPROCAL ACTIVE BALUN STRUCTURE

The present application claims priority under 35 U.S.C. §119 of French patent application No. 0707855000, which was filed in the French Patent Office on Nov. 9, 2007 and which is incorporated by reference herein in its entirety.

FIELD OF THE INVENTION

The present invention relates to the field of electronic devices known as baluns, and more specifically to the field of broadband mixers, used notably in radio transmission and reception circuits, and produced with the use of baluns.

BACKGROUND OF THE INVENTION

There is a significant demand for broadband mixers in present-day industry. These circuits are used in some reception and transmission circuits. It is possible to envisage numerous architectures for the production of mixers. These include, in particular, what are known as "balanced" or "double-balanced" structures which offer the best performance in terms of parasitic frequency rejection and very good channel isolation. There is a known way of producing a double-balanced mixer using a field-effect transistor bridge or a diode bridge. In order to produce such a circuit in MMIC (Monolithic Microwave Integrated Circuit) technology which can operate over a wide frequency range, it is necessary to use functional units known as broadband baluns.

The term "balun", which is a contraction of the expression "balanced-unbalanced", generally denotes a three-terminal device capable of either splitting an input signal into two output signals which have the same amplitude and have a phase difference of 180° between them, thus forming a power splitter with outputs in phase opposition (a splitter balun), or combining two input signals in such a way that the output signal represents the difference between the input signals, thus forming a combiner circuit with inputs in phase opposition (a combiner balun).

There are currently two known methods of producing baluns.

In the first method, shown in FIG. 1, mid-point transformers 12, 13 and 14 are produced and used to drive, for example, a field-effect transistor bridge 11. This device, which is passive and reciprocal, can advantageously provide both of the aforementioned functions. However, it is very difficult to use planar technology to produce a circuit of this type for operation at hyperfrequency. Moreover, it cannot be used for operation over a very wide frequency band (more than two to three octaves) or at low frequency (f<1 GHz).

In the second method, an active balun is used, based on a distributed structure, as described in the French patent application filed by the present applicant on 21 Dec. 2005 and published under the number 2 895 168. This active balun combines two balanced structures, one of which is composed of amplifier cells of the "cascade" or "Darlington" type, while the other is composed of amplifier cells of the "cascode" type. This specific circuit can be used, notably, to resolve the problem of gain unbalance between channels, which generally occurs in conventional circuits in the form of unbalance between the two output channels (in a splitter circuit) or between the two input channels (in a combiner circuit). It also enables a phase difference of 180° to be produced between channels.

This second method can be used to produce baluns operating at low frequencies and in much wider frequency bands (on the order of a decade or more) than those at which other existing devices operate. It is therefore a more advantageous solution than the first method. However, the active structures produced in this way are not reciprocal. Unfortunately, therefore, it is necessary to produce two different structures in order to produce a splitter and a combiner. If this type of structure is used in a mixer, the mixer will be unilateral.

Thus, regardless of which method is chosen, it is not possible at present to design an active balun, operating over a very wide frequency band (of the order of a decade), which is reciprocal and which can handle low frequencies (f≦1 GHz).

Consequently, anyone wishing to produce a reciprocal balun at the present time has to use a passive balun, for example a structure such as that of the Marchand balun. This structure, which is known and is illustrated in FIG. 2, is based on line coupling, with a main line 21 having a length of λ/2 and two lines 22 and 23 coupled to the main line and each having a length of λ/4, these two lines being arranged so as to provide signals of the same value and in phase opposition on their respective outputs 25 and 26. This structure can be used advantageously to produce reciprocal baluns. However, the use of passive couplers gives rise to problems of large overall dimensions, especially when operation at relatively low frequencies (around 1 GHz) is desired, since the passive coupler must always have a length of λ/2 with respect to the central operating frequency of the mixing device in which it is incorporated. This type of structure is therefore difficult to incorporate in MMIC technologies. Moreover, because of its structure, a balun of this type cannot be used for broadband applications (covering several octaves).

SUMMARY OF THE INVENTION

In view of the limitations associated with the design of traditional balun structures, embodiments of the present invention provide balun type structures which are both reciprocal and broadband (having a bandwidth of more than an octave).

In one embodiment, the invention provides a reciprocal active balun, including:

an active splitter balun element including a first transmission line coupled to a second and a third transmission line, a first directive active coupling of the first transmission line to the second transmission line being provided by means of distributed cascode amplifier cells connected to the two transmission lines, and a second directive active coupling of the first transmission line to the third transmission line being provided by means of distributed Darlington amplifier cells connected between the two transmission lines, an active combiner balun element including a first and a second transmission line, each coupled to a third transmission line, a first directive active coupling of the first transmission line to the third transmission line being provided by means of distributed cascode amplifier cells connected to the two transmission lines, and a second directive active coupling of the second transmission line to the third transmission line being provided by means of distributed Darlington amplifier cells connected to the two transmission lines, The device according to this embodiment also being characterized in that the splitter balun and combiner balun elements are integrated so as to form three transmission lines, a first active coupling being provided between the first and second transmission lines by means of cascode amplifier cells of the splitter and combiner balun elements, and a second active coupling being provided between the first and third transmission lines by means of the Darlington amplifier cells of the splitter and combiner balun elements.

The device according to this embodiment is also characterized in that it has configurable means for polarizing the different amplifier cells so as to create a specific coupling direction between the first and second transmission lines on the one hand, and between the first and third transmission lines on the other hand.

In some embodiments, the device has an operating mode in which the device acts as a splitter balun. In these embodiments, when operating as a splitter balun, the means for polarizing the amplifier cells are configured and controlled in such a way that they activate the amplifier cells which provide directive coupling in the splitter balun element and deactivate the amplifier cells which provide the directive coupling in the combiner balun element.

In some embodiments, the device has an operating mode in which the device acts as a combiner balun. In these embodiments, when operating as a combiner balun, the means for polarizing the amplifier cells are configured and controlled in such a way that they deactivate the amplifier cells which provide directive coupling in the splitter balun element and activate the amplifier cells which provide the directive coupling in the combiner balun element.

The device according to the invention has the advantage of being a reciprocal active element which can provide one or other of the functions of a splitter balun or combiner balun on command.

The reciprocal nature of the device is an advantageous addition to the features of large bandwidth and wide operating range of the non-reciprocal active baluns known from the prior art.

The features and advantages of the invention will be made more evident by the following description which relates to a specific embodiment of the invention, to be considered as a non-limiting example, and which refers to the appended drawings, in which

DETAILED DESCRIPTION OF THE EMBODIMENTS

Figure 1:
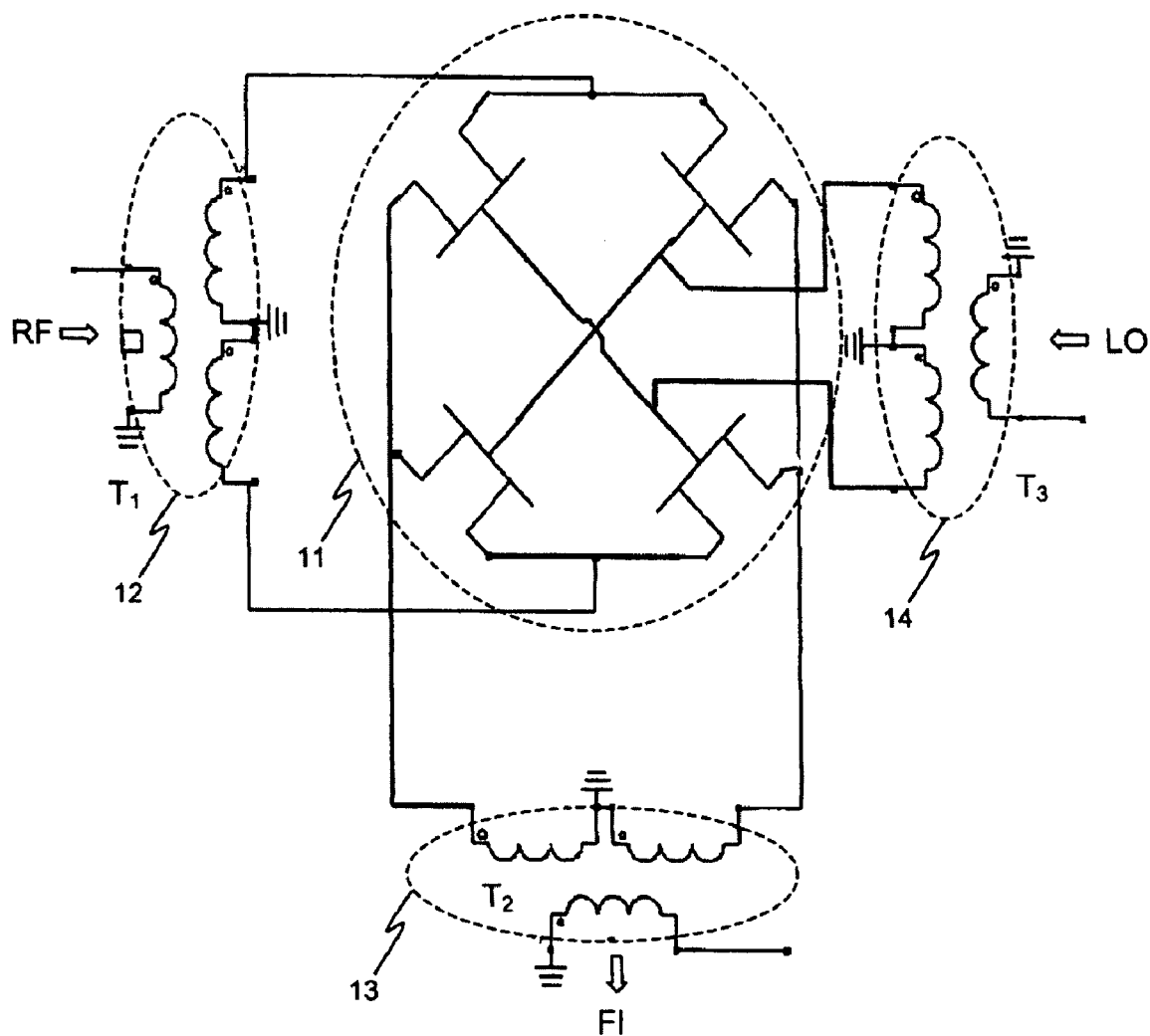
FIG. 1 is a diagram showing the structure of a double-balanced mixer based on a field-effect transistor bridge, the mixer using transformer-based passive baluns according to the prior art.
Figure 2:
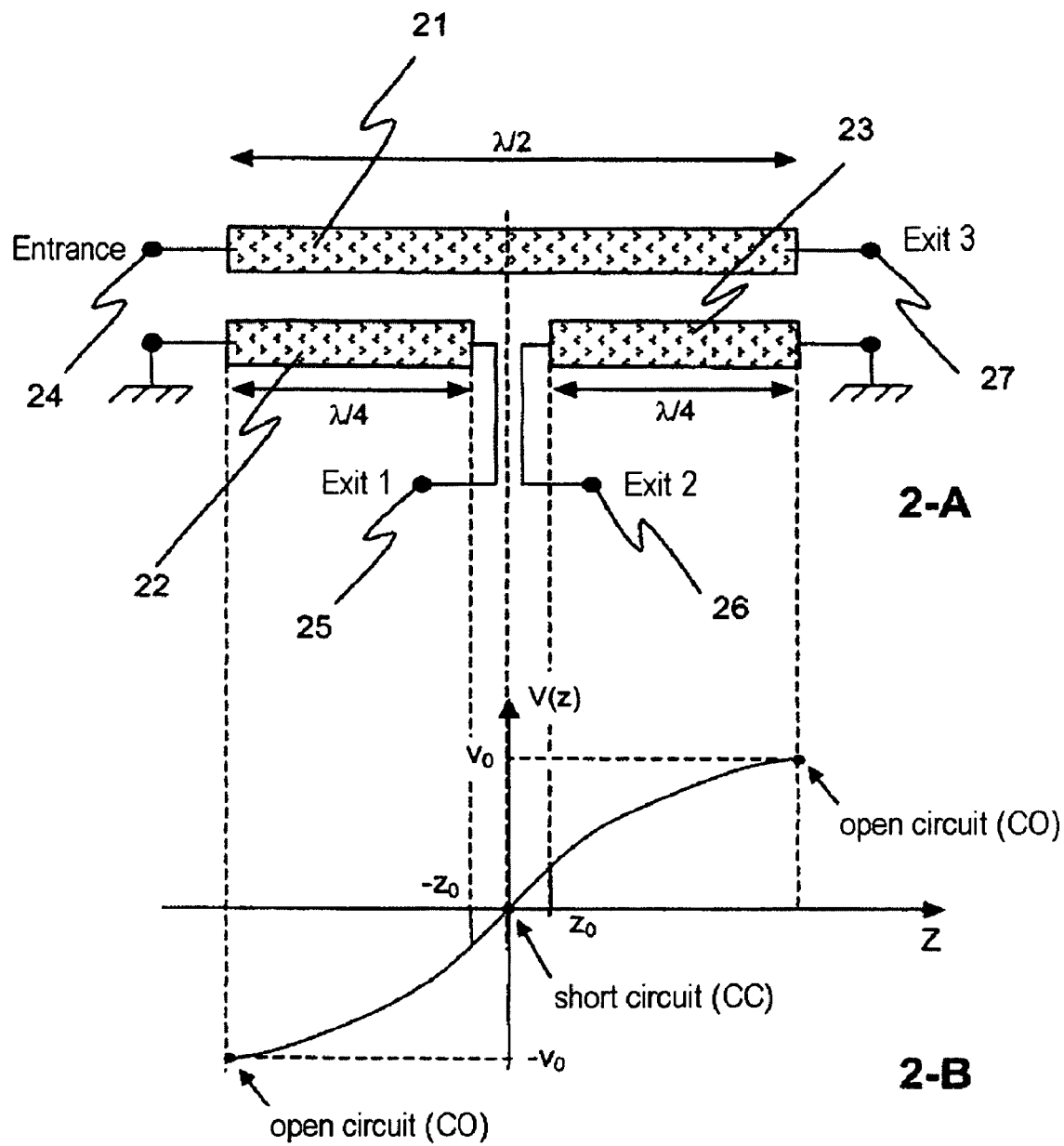
FIG. 2 is a diagram showing the structure of the Marchand balun.
Figure 3:
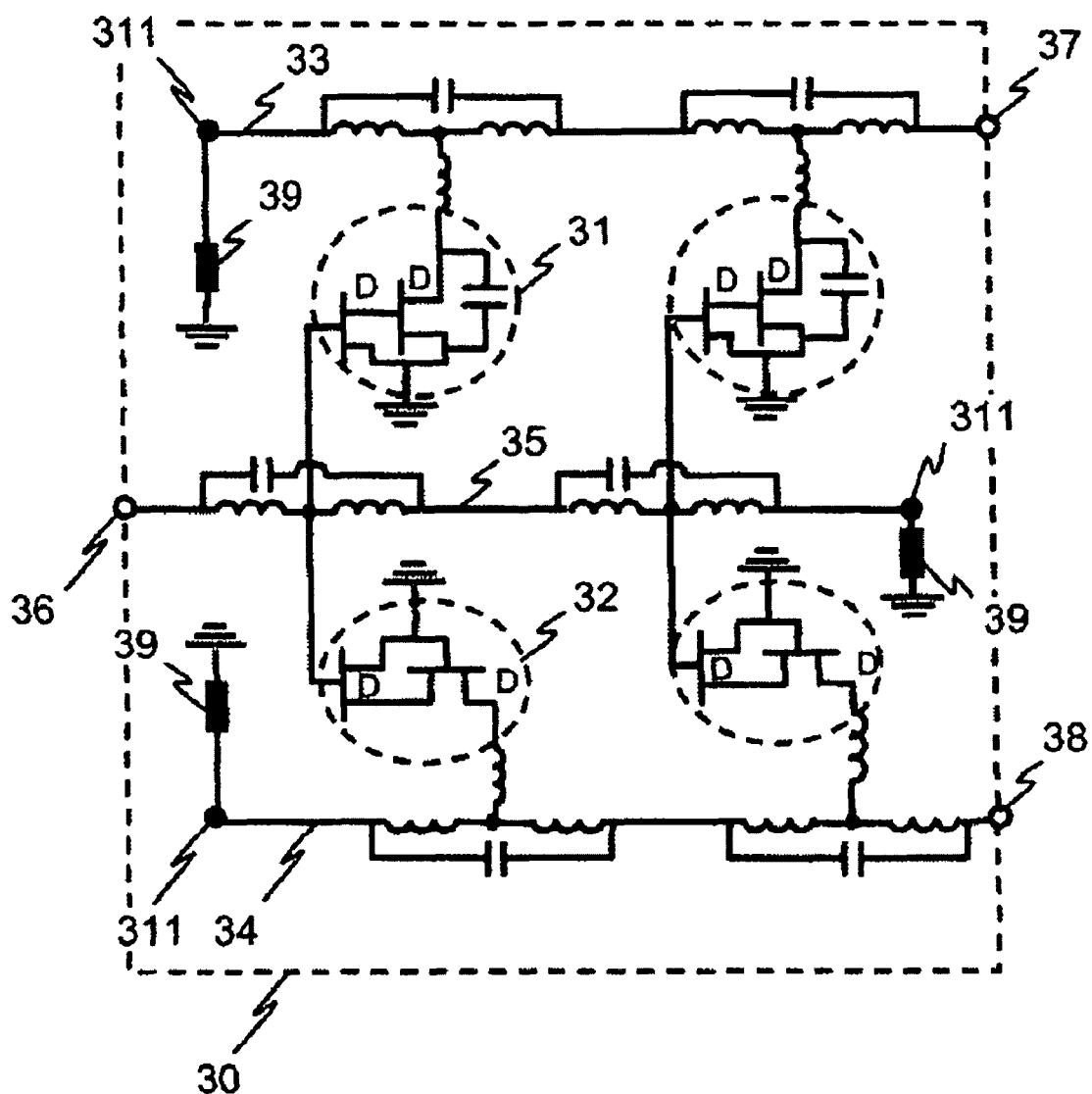
FIG. 3 is a diagram showing the known structure of a non-reciprocal broadband active balun, based on a distributed structure forming actively coupled lines, in a splitter balun configuration.
Figure 4:
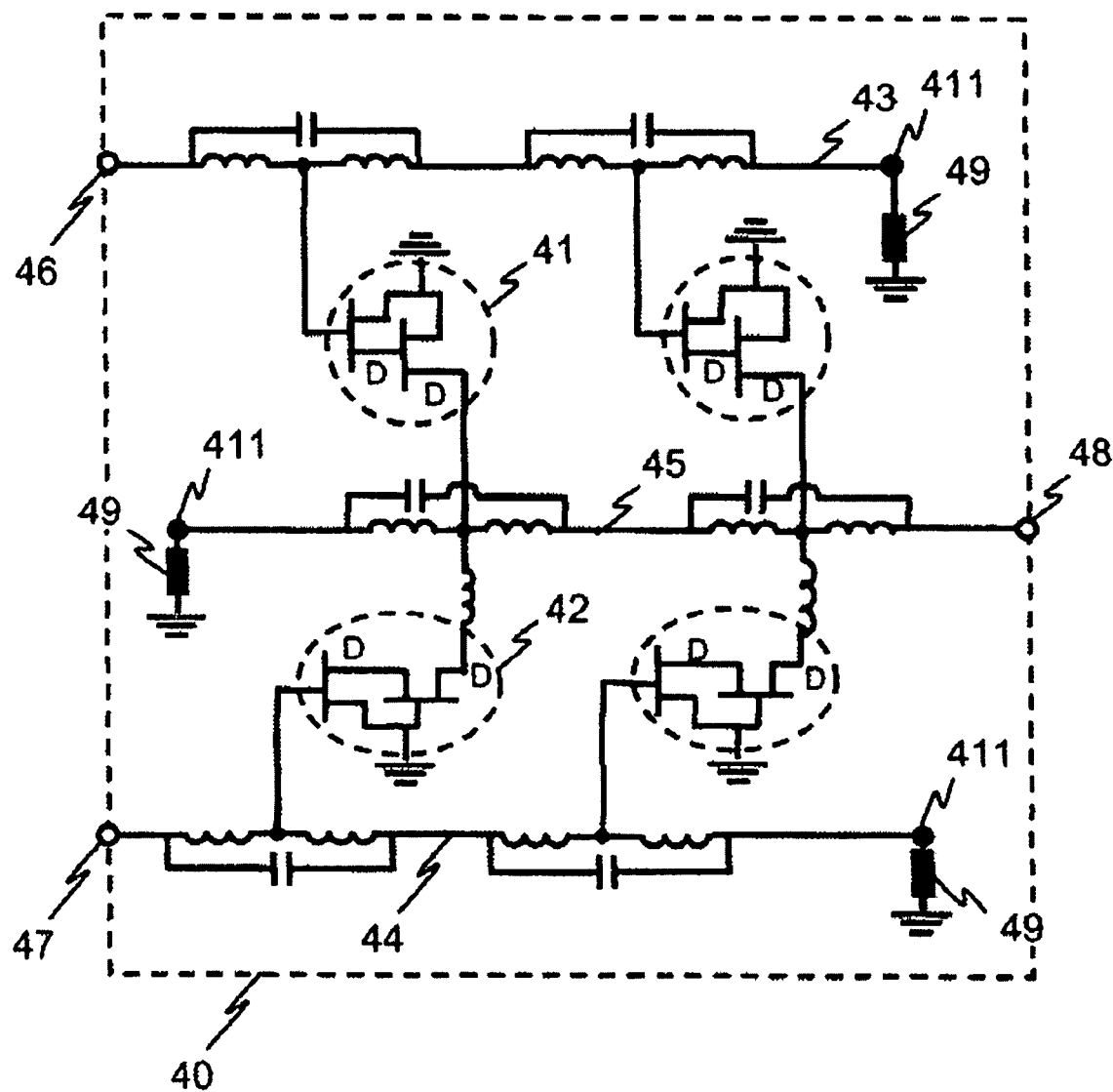
FIG. 4 is a diagram showing the known structure of a non-reciprocal broadband active balun, based on a distributed structure forming actively coupled lines, in a combiner balun configuration.

Let us start by considering FIGS. 3 and 4 which are schematic illustrations of the two active distributed structures from which the device according to the invention was developed.

These two basic structures are very fully described in the French patent application filed by the present applicant on 21 Dec. 2005 and published under the number 2 895 168. Consequently, their operation is not described in detail here, but the important elements will be indicated. FIG. 3 shows a first structure arranged to form a non-reciprocal active balun acting as a splitter device, while FIG. 4 shows a second structure arranged to form a non-reciprocal active balun acting as a combiner device.

For this purpose, the structure of FIG. 3 has three transmission lines 33, 34 and 35, coupled by means of active amplifier cells 31 and 32, shown schematically in the drawing, each amplifier cell being formed from transistors (such as field-effect transistors) assembled to form a circuit of the cascode type (cells 32) or Darlington type (cells 31). These two types of circuit are known to provide a phase difference of about 180° with respect to each other in transmission.

The cells 31 and 32 are also polarized so as to provide directive active coupling between the main line 35 (the gate line) and the secondary lines 33 and 34 (the drain lines). Thus a signal on the line 35 can be propagated by active coupling to the lines 33 and 34, but the reverse operation is not possible. The signal applied to the input 36 of the device is thus propagated onto the two secondary lines 33 and 34 coupled to the line 35 in the form of two signals in phase opposition, these signals being delivered on the outputs 37 and 38 respectively of the lines.

Similarly, the structure of FIG. 4 also has three transmission lines 43, 44 and 45 for this purpose, these lines being coupled by means of active amplifier cells 41 and 42, shown schematically in the drawing, each amplifier cell being formed from transistors (such as field-effect transistors) assembled to form a circuit of the cascode type (cells 42) or Darlington type (cells 41). The cells 41 and 42 are also polarized so as to provide active coupling between the secondary lines 43 and 44 (the gate lines) and the main line 45 (the drain line). Thus signals on the lines 43 and 44 can be propagated by coupling onto the line 45, but the reverse operation is not possible. The signals applied to the inputs 46 and 47 of the device are thus propagated by coupling onto the main line 45 and form a combined signal corresponding to the difference between the two input signals, because of the intrinsic 180° difference between the phases of the cascode and Darlington circuits, which is delivered to the output 48.

In these two structures, active coupling is thus provided by means of cascode cells 32, 42, and Darlington cells 31, 41, distributed between a gate line and a drain line. The number of cells is also determined, in particular, by the desired coupling and gain characteristics. The illustrations in FIGS. 3 and 4 show non-limiting examples in which the lines have two cells. The propagation lines formed in this way are also terminated at their unused ends by terminal loads 39, 49.

As stated previously, these two active structures have the advantage of making it possible to produce baluns having a large bandwidth and capable of operating at low frequencies, typically from about a hundred megahertz. However, baluns made in this way have the disadvantage of not being reciprocal in their operation, making it necessary to use different devices according to whether it is desired to split one signal into two signals or to combine two signals into one signal. Since said devices are produced in the form of integrated circuits, it is therefore necessary to use two different types of circuit.

Figure 5:
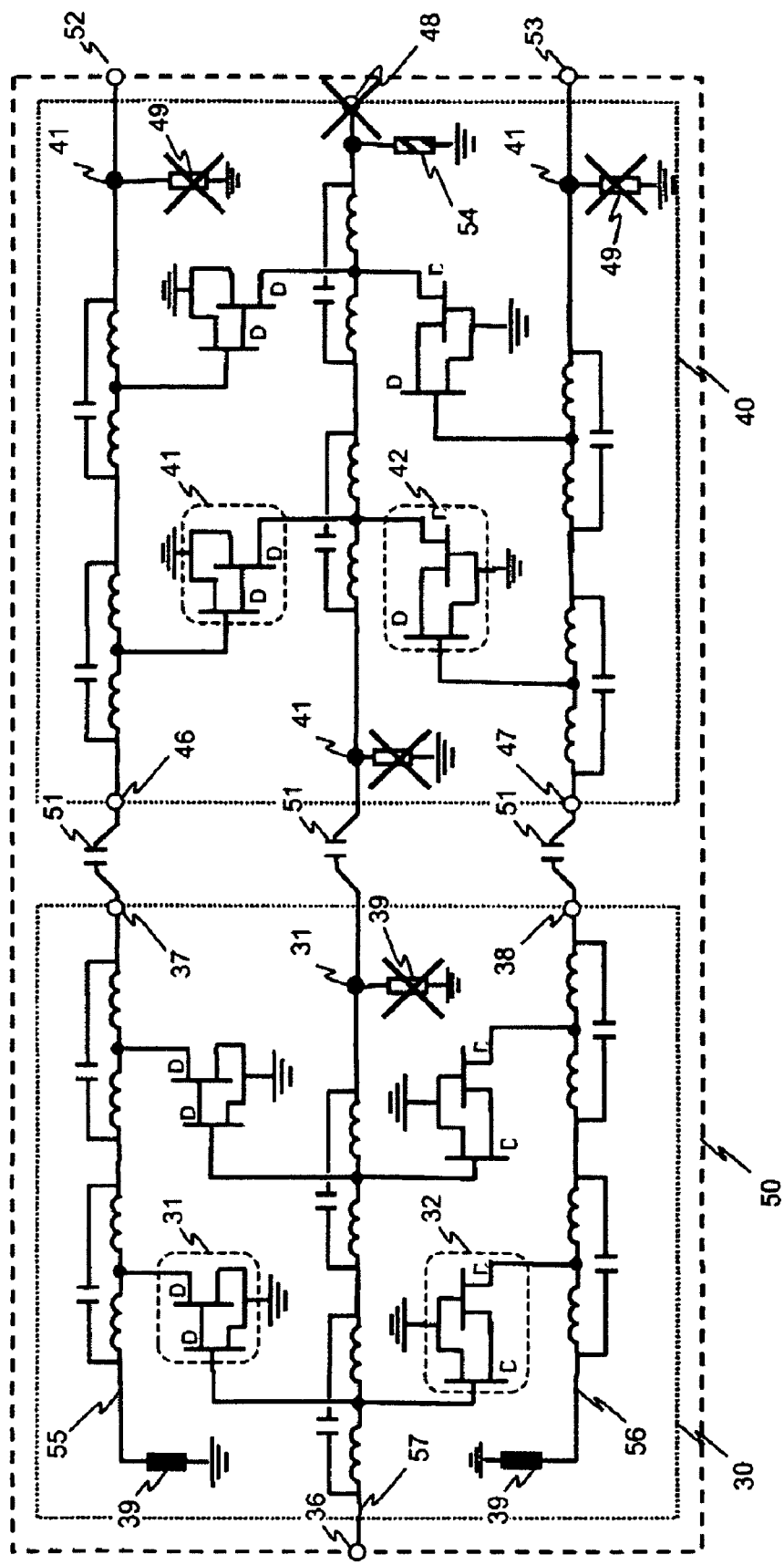
FIG. 5 shows the structure of a reciprocal broadband active balun according to one embodiment of the present invention.

We will now consider FIG. 5 which shows a schematic diagram of the reciprocal active balun according to the invention.

As shown in FIG. 5, the architecture of the reciprocal balun according to one embodiment of the present invention is based on the integration of the architecture of an active balun 30 of the splitter type with that of an active balun 40 of the combiner type. These two architectures are initially integrated by connecting the outputs 37 and 38 of the propagation lines 33 and 34 of the splitter balun 30 to the inputs 46 and 47 of the propagation lines 43 and 44 of the combiner balun 40. The integration is then continued by the connection of the common lines of each of the structures, in other words by the connection of the gate line 35 of the splitter balun to the drain line 45 of the combiner balun.

It should be noted that each link between these lines is made via a capacitor 51 in order to achieve correct operation of the structure, and, in particular, to enable the cells of the splitter and combiner baluns to be controlled independently. The integration of these two architectures is completed by the removal of the matching loads 39 and 49 connected to the initially unused ends 311 and 411 of the main lines 35 and 45 and of the secondary lines 33, 34 and 43, 44. In the device according to this embodiment of the present invention, these ends are used to form the interconnection of the two common lines 35 and 45, and to provide two connection points to the ports 52 and 53 for connecting the device to an external circuit. Finally, the integration is completed by the removal of the output 48 of the initial combiner circuit 40 and by the addition of a matching load 54.

This produces a dual structure 50, having a splitter element connected in series with a combiner element, and having three ports 36, 52 and 53. This structure provides three propagation lines 55, 56 and 57, the lines 55 and 56 being coupled to the line 57 by active transistor cells. Advantageously, this dual structure makes it possible to produce an active splitter balun and an active combiner balun with equal facility, the ports 36, 52 and 53 being used alternatively as inputs or outputs. The rest of the description explains how the structure according to this embodiment of the present invention can be used to provide one or other function.

In the device according to this embodiment of the present invention, which is a reciprocal active balun, the coupling of the line 55 to the line 57 is provided by active Darlington cells 31 and 41. The amplifier cells 31 are used for the directive coupling of the line 57 to the line 55, and the amplifier cells 41 are used for the directive coupling of the line 55 to the line 57. Similarly, the coupling of the line 56 to the line 57 is provided by active amplifier cells of the cascode type, 32 and 42. The cells 32 are used for the directive coupling of the line 57 to the line 56, and the cells 42 are used for the directive coupling of the line 56 to the line 57. However, this arrangement of active cells is not the only possible one, as the device operates equally well if the cells 41 and 42 are interchanged.

To enable this dual architecture to operate, the device according to this embodiment of the present invention also includes means, not shown in FIG. 5, for providing, according to the desired operating mode (splitter balun or combiner balun mode), the corresponding polarization of the different active cells 31, 32, 41 and 42. According to this embodiment of the present invention, it is possible to use any means for polarizing the different cells providing the active coupling, to bring them into either an active (or "passing") state or an inactive state. This means can, for example, be a control device which polarizes the different cells, as a function of the value of a control voltage applied to an input of the device according to the invention, so as to establish an appropriate coupling direction for the operating mode concerned.

Figure 6:
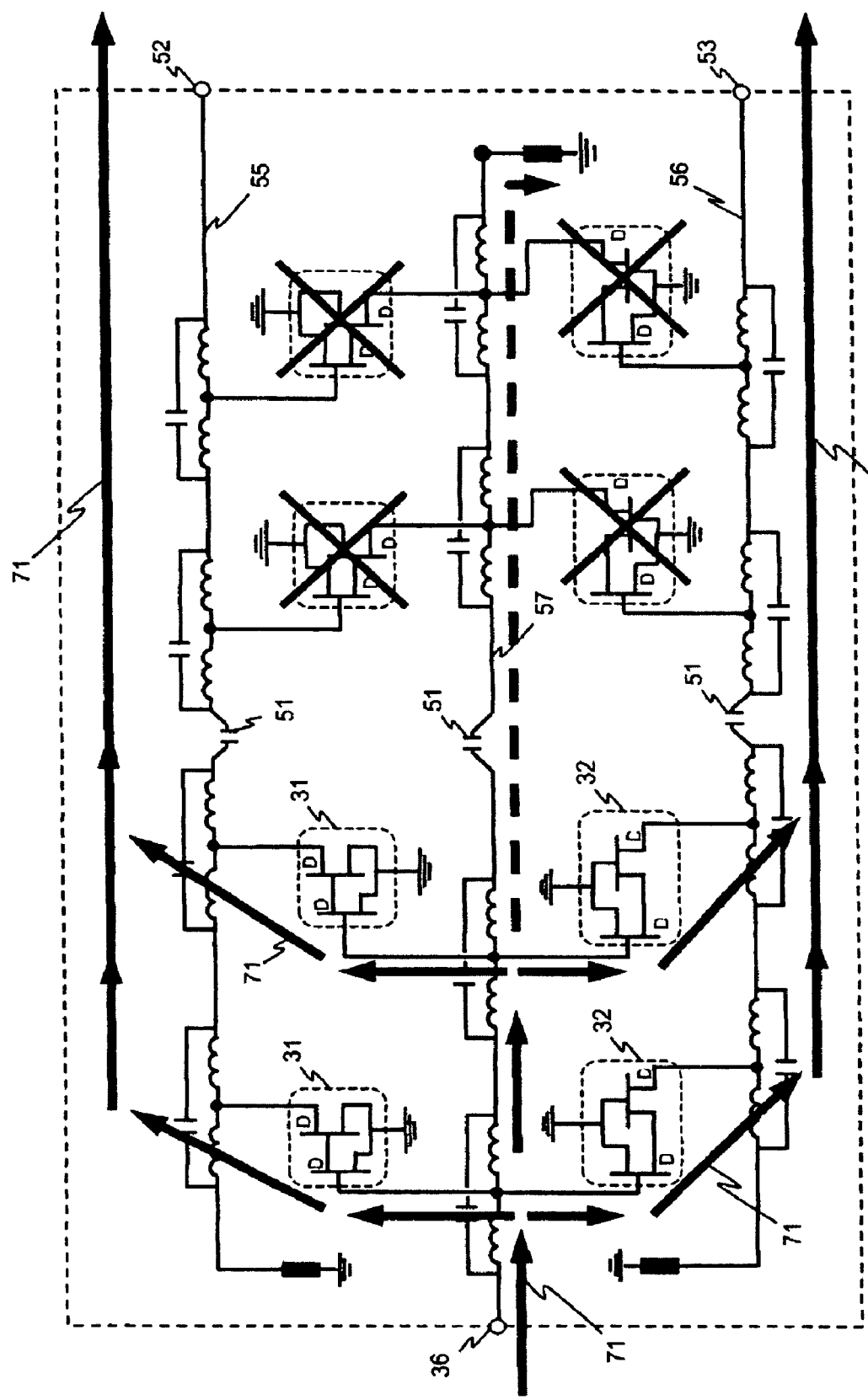
FIG. 6 illustrates the use of a reciprocal active balun according to one embodiment of the present invention in splitter balun mode.
Figure 7:
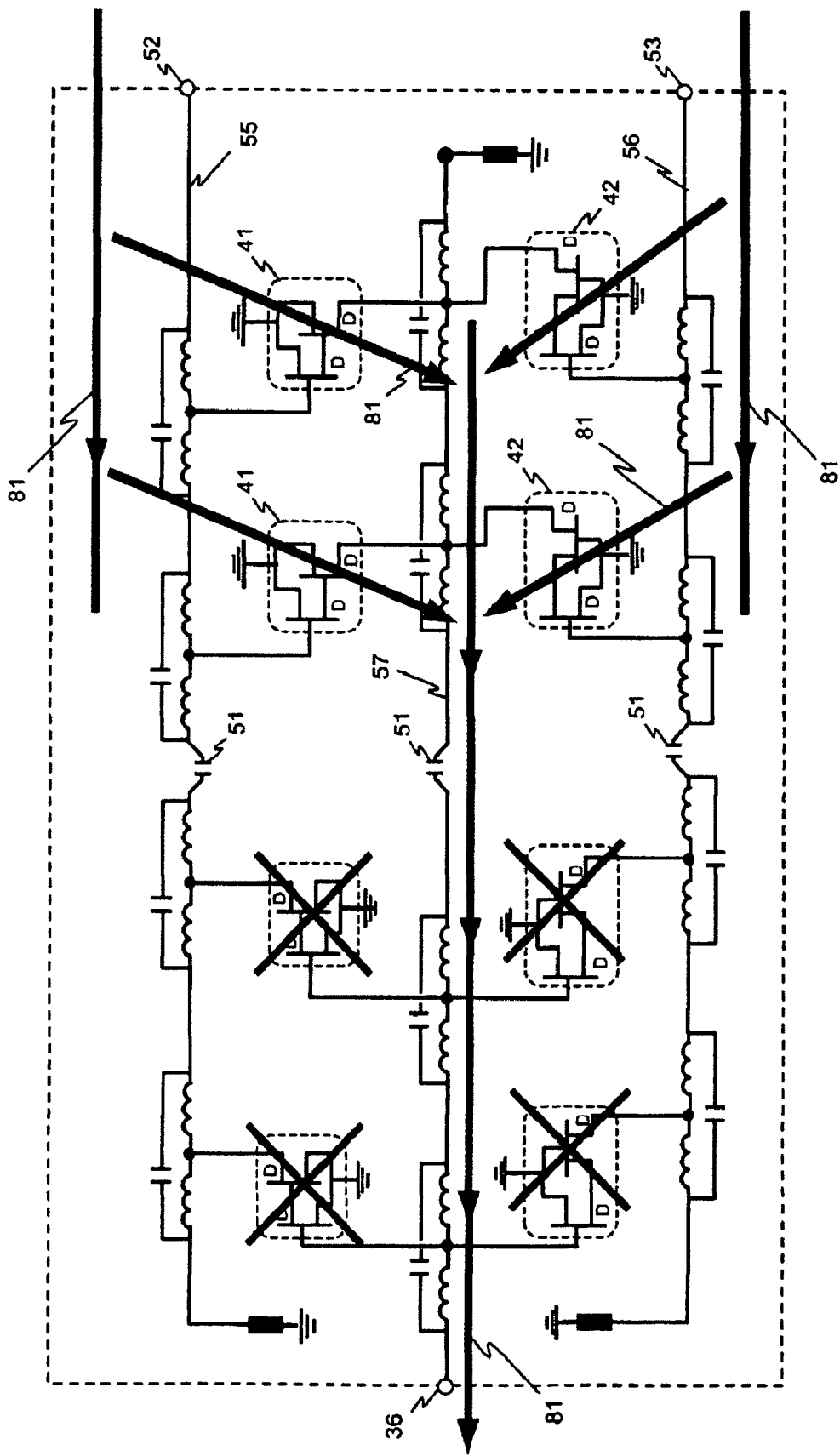
FIG. 7 illustrates the use of a reciprocal active balun according to one embodiment of the present invention in combiner balun mode.

It is important to note that, when a line (a gate line or a drain line) or a portion of line is connected to cells polarized to the "inactive" state, this line becomes purely passive and decoupled from any other line parallel to it, and that a signal which may be propagated along this line, in one or other direction, undergoes very little attenuation. FIGS. 6 and 7 illustrate the description of the two operating modes which characterize this embodiment of the present invention.

FIG. 6 is a schematic illustration of the operation of this embodiment of the device according to the present invention when it is configured to operate as a splitter balun. In this first configuration, the amplifier cells 31 and 32 are polarized in such a way that they provide active coupling of the line 57 to the lines 55 and 56, while the amplifier cells 41 and 42 are polarized in such a way that they are inactive. As the drawing also shows, if a signal is applied to the input 36 of the line 57 it is propagated by active coupling onto the lines 55 and 56 and to the outputs 52 and 53 of the device, as shown by the arrows 71. In this first configuration, the active cells of the splitter element are therefore polarized in such a way that they amplify the signal between the input line 57 (the gate line in this case) and the two output lines 55 and 56 (the drain lines in this case). Since the splitter element is composed of cascode cells 32 and Darlington cells 31, the signal arriving on the gate line via the input port 36 is split into two signals having the same amplitude and in phase opposition, which are available at the output ports 52 and 53.

Conversely, the active cells of the combiner element are polarized in such a way that the amplifier cells which form them isolate the lines 55 and 56 from the line 57, thus preventing the signals on these lines from being recombined in any way on the line 57.

FIG. 7 is a schematic illustration of the operation of the device according to this embodiment of the present invention when it is configured to operate as a combiner balun. In this first configuration, the cells 41 and 42 are polarized in such a way that they provide active coupling of the lines 55 and 56 to the line 57, while the cells 31 and 32 are polarized in such a way that they are inactive. Thus, as shown in the drawing, if signals are applied to the inputs 52 and 53 of the lines 55 and 56, they are combined by active coupling on the line 57, the signal resulting from this combination being propagated to the output 36 of the device, as shown by the arrows 81. In this second configuration, the active cells of the combiner element are therefore polarized in such a way that they amplify the signal between the two lines 55 and 56 (the gate lines in this case) and the line 57 (the drain line in this case). Since the combiner element is composed of cascode amplifier cells 42 and Darlington amplifier cells 41, two signals arriving on the two gate lines 55 and 56, with identical amplitudes and opposite phases, are added on the line 57, the addition signal being delivered at the output port 36 of the device.

Conversely, the active amplifier cells of the splitter element are polarized in such a way that the amplifier stages which form them isolate the line 57 from the lines 55 and 56, thus preventing any propagation on the lines 55 and 56 of the signal combined by coupling.

This embodiment of the device according to the present invention therefore acts as a reciprocal active balun.

The invention claimed is:

1. A reciprocal active balun, comprising:

an active splitter balun element having a first transmission line, a second transmission line and a third transmission line, forming a first distributed amplifier structure and a second distributed amplifier structure, wherein the first and second distributed amplifier share a first transmission line, and wherein:

the first distributed amplifier structure comprises a plurality of distributed cascode amplifier cells which are connected to the first transmission line and to the second transmission line so as to permit a non-reciprocal active coupling of the signal from the first transmission line to the second transmission line; and the second distributed amplifier structure comprises a plurality of distributed Darlington amplifier cells, connected between the first transmission line and the third transmission line so as to permit a non-reciprocal active coupling of the signal from the first transmission line to the third transmission line; and an active combiner balun element having a fourth transmission line, a fifth transmission line and a sixth transmission line, forming a third distributed amplifier structure and a fourth distributed amplifier structure, wherein the third and fourth distributed amplifier structures share a fourth transmission line, and wherein:

the third distributed amplifier structure comprises a plurality of distributed cascode amplifier cells, connected to the fourth transmission line and to the fifth transmission line so as to permit a non-reciprocal active coupling of the signal from the fifth transmission line to the fourth transmission line; and the fourth distributed amplifier structure comprises a plurality of distributed Darlington amplifier cells, connected to the fourth transmission line and to the sixth transmission line so as to permit a non-reciprocal active coupling of the signal from the sixth transmission line to the fourth transmission line;

wherein the active splitter balun and active combiner balun elements are arranged in such a way that the first transmission line of the splitter balun element is coupled to the fourth transmission line of the combiner balun element through a first capacitor to form a first combined transmission line, while the third transmission line of the splitter balun element is coupled to the sixth transmission line of the combiner balun element through a second capacitor to form a second combined transmission line, and the second transmission line of the splitter balun element is coupled to the fifth line of the combiner balun element through a third capacitor to form a third combined transmission line;

wherein the distributed Darlington amplifier cells and the distributed cascode amplifier cells of the first through fourth distributed amplifier structures can be polarized so as to provide a specific direction of coupling between the first combined transmission line and the second combined transmission line on one hand, and between the first combined transmission line and the third combined transmission line on the other hand;

wherein a first active coupling is provided between the first combined transmission line and the second combined transmission line by the distributed cascode amplifier cells of the splitter and combiner baluns;

and wherein a second active coupling is provided between the first combined transmission line and the third combined transmission line by the distributed Darlington amplifier cells of the splitter and combiner baluns.

2. The reciprocal active balun of claim 1, characterized in that, for operation in splitter mode, the amplifier cells are configured to activate the amplifier cells that provide the directive coupling in the splitter balun element, and to deactivate the amplifier cells that provide the directive coupling in the combiner balun element.

3. The reciprocal active balun of claim 1, characterized in that, for operation in combiner mode, the amplifier cells are configured to activate the amplifier cells that provide the directive coupling in the combiner balun element, and to deactivate the amplifier cells that provide the directive coupling in the splitter balun element.

* * * * *